United States Patent
Baghai-Kermani

[19]

[11] Patent Number: 5,554,819
[45] Date of Patent: Sep. 10, 1996

[54] METHOD AND APPARATUS FOR THE THERMOELECTRIC GENERATION OF ELECTRICITY

[76] Inventor: A. Baghai-Kermani, 515 E. 88th St. Apt. 5-L, New York, N.Y. 10128

[21] Appl. No.: 823,925

[22] Filed: Jan. 22, 1992

[51] Int. Cl.⁶ .................................................. H01L 35/30
[52] U.S. Cl. .................... 136/206; 136/208; 136/218; 136/224; 136/225; 310/306; 322/2 R
[58] Field of Search ..................................... 136/205, 206, 136/208, 218, 225, 224; 318/116, 117; 310/306; 322/2 R

[56] References Cited

U.S. PATENT DOCUMENTS

| | | | |
|---|---|---|---|
| 3,082,276 | 3/1963 | Corry et al. | 136/4 |
| 3,269,872 | 8/1966 | Thompson | 136/208 |
| 3,606,982 | 9/1971 | Anderson | 261/29 |
| 3,738,621 | 6/1973 | Anderson | 261/29 |
| 3,794,527 | 2/1974 | Kim | 136/208 |
| 3,879,229 | 4/1975 | Gilbert | 136/208 |
| 4,056,406 | 11/1977 | Markman et al. | 136/208 |
| 4,125,122 | 11/1978 | Stachurski | 136/205 |
| 4,363,938 | 12/1982 | Daaboul et al. | 179/170.2 |
| 4,677,416 | 6/1987 | Nishimoto et al. | 338/35 |
| 5,087,312 | 2/1992 | Gerber et al. | 136/225 |

*Primary Examiner*—Charles T. Jordan
*Assistant Examiner*—Chrisman D. Carroll
*Attorney, Agent, or Firm*—Jordan & Hamburg

[57] ABSTRACT

A thermoelectric generator includes a plurality of thermoelectric junctions embedded in each of a pair of thermally conductive and electrically non-conductive layers, these layers being separated by a thermally and electrically non-conductive layer. The junctions are connected to form a thermopile. An absorbent layer is provided adjacent one of the thermally conductive layers. A liquid such as water is applied to the absorbent layer, so that evaporation of the liquid from the absorbent layer enhances the temperature differential between the two thermally conductive layers.

8 Claims, 3 Drawing Sheets

METHOD AND APPARATUS FOR THE THERMOELECTRIC GENERATION OF ELECTRICITY

FIELD OF THE INVENTION

This invention relates to an improved method and apparatus for generating electricity employing a thermoelectric generator, such as a plurality of thermoelectric junctions or couples interconnected to form a thermopile.

BACKGROUND OF THE INVENTION

In the past, thermoelectric systems have been employed for power generation. As an example, U.S. Pat. No. 4,363,938, Wilson, discloses a thermoelectric generating panel wherein a plurality of serially connected thermocouples are arranged with alternate couples aligned in a pair of spaced apart rows, the thermocouples being disposed on a substrate. The assembly is enclosed in a chamber through which water is pumped or circulated, for example by the power generated by the thermoelectric generating panel. The water is intended to maintain the two rows of thermocouples at different temperatures.

The control of the temperature of the junctions in a thermoelectric generator by flowing liquids and gases is also disclosed, for example, in U.S. Pat. No. 3,138,934, Roane; U.S. Pat. No. 4,284,838, Indech; U.S. Pat. No. 4,448,028, Chao et al; U.S. Pat. No. 4,734,139, Shakun et al; U.S. Pat. No. 4,275,259, Yamamoto et al; and U.S. Pat. No. 4,420,940, Buffet. The requirement in such devices for the circulation of liquids necessitates extensive external equipment, and hence limits the adaptability of the devices for many applications. The use of circulating gases, on the other hand, reduces the efficiency of the devices.

In these references, Roane, Shakun et al and Chao et al disclose the use of thermoelectric devices in vehicles.

While the provision of evaporative cooling systems, for example for vehicular applications, is also well known, for example as disclosed in U.S. Pat. No. 3,606,982, Anderson; U.S. Pat. No. 3,738,621, Anderson; and U.S. Pat. No. 4,549,406, Ebner et al, these arrangements are not disclosed as being adaptable to systems for the thermoelectric generation of electricity.

SUMMARY OF THE INVENTION

Briefly stated, in accordance with one aspect of my invention, a thermoelectric generator is provided, for example (although not exclusively) for use in or in combination with a vehicle. The generator is comprised of a thermopile panel. The "hot" side of the panel is adapted to be directly or indirectly exposed to the sun. The "cold" side of the panel has a water-absorbent surface, and water is continually applied to the water-absorbent surface. As a result, the "cold" side of the panel is cooled by evaporation of the water, to increase the temperature differential between the sides of the panel. The electricity generated by the panel may be employed, for example, in the movement of the vehicle, the powering of other devices on the vehicle, and/or it may be stored in batteries of the vehicle.

BRIEF DESCRIPTION OF THE DRAWING

In order that the invention may be more clearly understood, it will now be disclosed in greater detail with reference to the accompanying drawing, wherein.

DETAILED DISCLOSURE OF THE INVENTION

Figure 1:
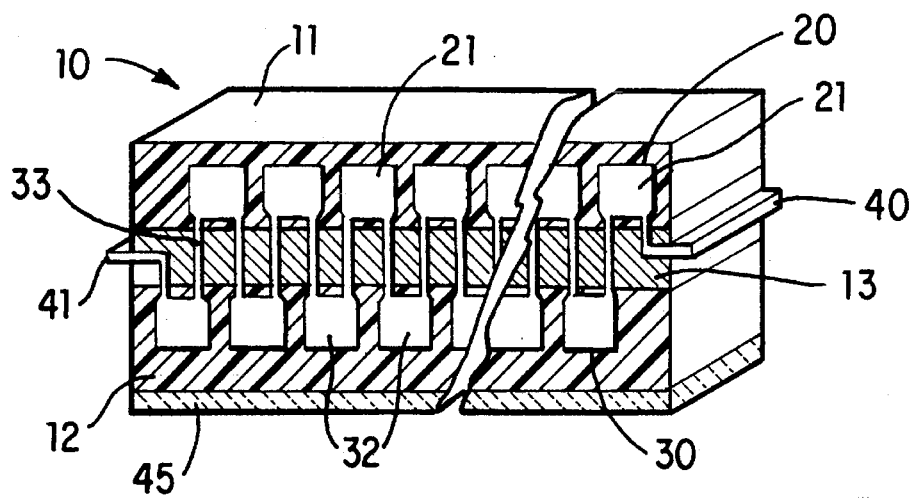
FIG. 1 is a cross sectional perspective view of a thermoelectric generator panel in accordance with one embodiment of the invention.

Referring now to the drawings, therein is illustrated a thermoelectric generator panel 10 in accordance with the invention. The term "panel", as used herein, is not limited to flat structures, but broadly includes other shapes having a pair of opposed surfaces. One surface 11 of the panel is comprised of a layer of an electrically non-conductive material that is generally thermally conductive. While various ceramic materials have such properties, it will be evident that the invention is not limited to ceramic materials.

The layer 11 is spaced from a layer 12 of the same or similar material, by an intermediate layer 13 of electrically non-conductive thermally non-conductive materials. The layer 13 may be, for example of various known mechanically stable thermal insulating materials such as, for example, rigid or semirigid epoxy resins. The invention is of course not limited to such materials. In general, suitable materials for the layers 11 and 12 should be as non-conductive to electricity as possible, and have as great a thermal conductivity as possible, taking into consideration the structural strength, rigidity and other physical requirements of the application, and the layer 13 should be as thermally nonconductive and electrically nonconductive as possible taken in view of such considerations.

A plurality of rows 20 of metallic or semi conductive thermocouples 21, only one row of which is seen in FIG. 1, is embedded in the layer 11, and a plurality of rows 30 of metallic or semi conductive thermocouples 32, only one row of which is seen in FIG. 1, is embedded in the layer 12. The thermocouples 21 of a row 20 are serially connected to the thermocouples 32 via conductors 33 extending through the layer 13, to form a thermopile. Thermocouples 21 and 32 are preferably, although not necessarily, alternately connected in the thermopiles, and, for simplicity in construction, interconnected rows 20, 30 of thermocouples are also preferably generally in a common plane.

Figure 2:
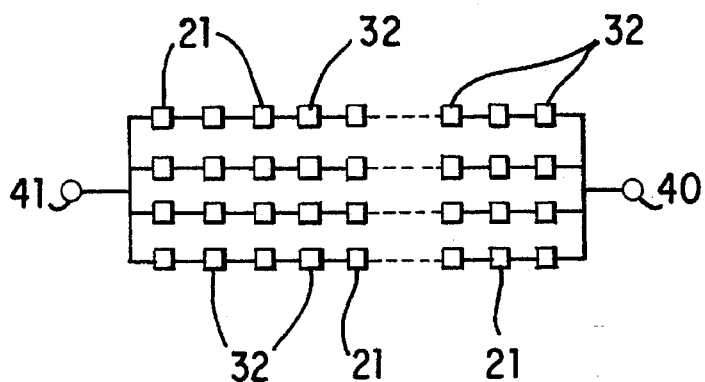
FIG. 2 is a simplified diagram of a series-parallel interconnection of thermocouples that may be used in accordance with the invention.

The two ends of the thermopiles are connected to opposite terminals 40, 41, and the other thermopiles (not illustrated) in the panel may be connected in series or parallel with the illustrated thermopile, in a manner to provide an output voltage and current suitable for the given application. A series-parallel connection of this type is shown, for example, in FIG. 2.

Referring again to FIG. 1, a thin layer 45 of a moisture absorbent material is applied against the external surface of the layer 12. The moisture absorbent material may be, for example, a porous ceramic or plastic material, the material being capable of absorbing liquids such as water, so that the water can readily evaporate from the surface of the layer 45, especially when air moves across the surface of the layer 45.

In accordance with the invention, by providing the absorbent layer 45 on the thermoelectric generator, the temperature differential can be increased between the thermocouple junctions 21 and 32, so that a larger voltage will be generated between the terminals 40, 41. In order to enhance the voltage, and thus current flowing through a device connected between the terminals 40, 41, the layer 11 is advantageously exposed to the sun. Such exposure is not necessary, however, especially if air is caused to move across the absorbent layer. Evaporation of water from the layer 45 effects a cooling of the junctions 32 to maintain a temperature difference between the junctions 21, 32, so that a voltage will be generated even though the surface of the layer 11 is not exposed to the sun.

Accordingly, as opposed to prior generating arrangements employing solar cells, the arrangement of the present invention produces an electric current even in the absence of solar exposure.

Figure 3:
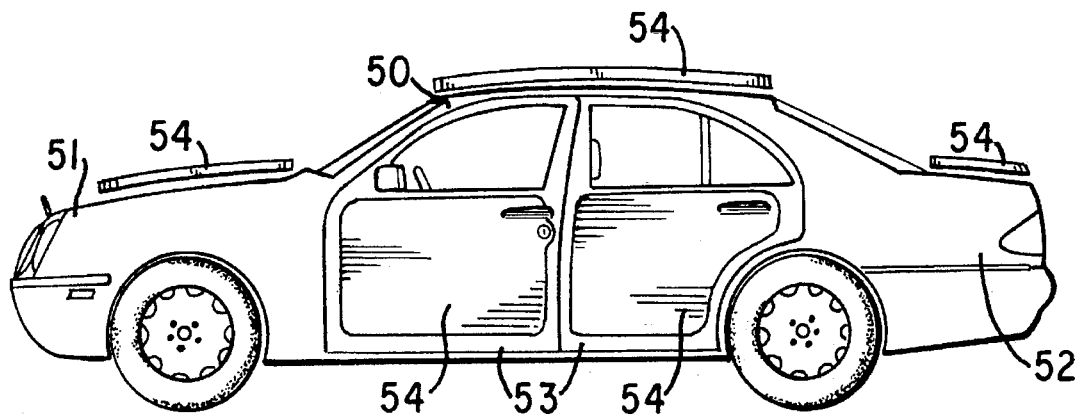
FIG. 3 is an illustration of a motor vehicle having thermoelectric generators in accordance with the invention mounted thereon.

FIG. 3 illustrates a motor vehicle having a roof 50, a hood 51, a trunk 52 and doors 53. In accordance with the invention, panels 54 of the type illustrated in FIG. 1 may be mounted to each of these surfaces of the vehicle by conventional means, slightly spaced from the respective surface of the vehicle to provide an air channel between the vehicle surface and the absorbent layer of the respective panel. As will be discussed, water or other volatile fluid is caused to flow onto the absorbent layer of the panel, so that the water evaporates from the absorbent layer when the air is moved in the channels, for example when the vehicle is moving. The channels should therefore be oriented to obtain the maximum airflow therethrough when the vehicle moves.

It is therefore apparent that, in accordance with the invention, a large portion of the external surface of the vehicle may be covered with thermoelectric generator panels, in order to maximize the generation of electricity. As discussed above, it is not necessary that the respective surfaces of the vehicle be in a position to be exposed to the sun.

It is further evident that, instead of mounting the panels 54 on the external surfaces of the vehicle, the panels may be built into the external surfaces of the vehicle, with air channels also being built into the vehicle adjacent the layers of absorbent material.

Figure 4:
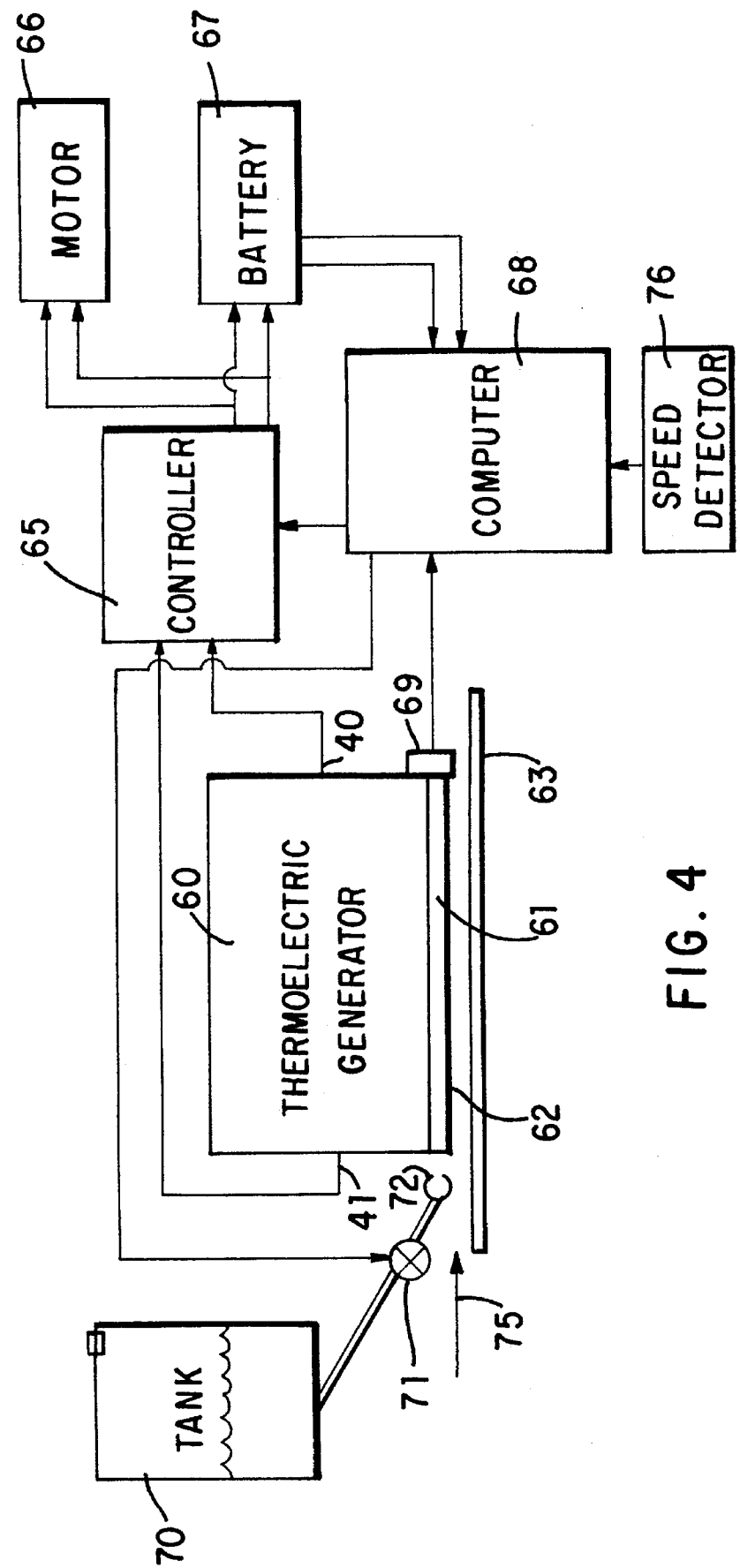
FIG. 4 is a block diagram illustrating a system employing the thermoelectric generator of the invention.

A system incorporating the thermoelectric generator of the invention is illustrated in FIG. 4. In this figure, block 60 denotes a thermoelectric generator of the type illustrated in FIG. 1, having an absorbent layer 61. The thermoelectric generator is mounted by conventional means to provide an air channel 62 between the absorbent layer 61 and a surface 63. The surface 63 may be the surface of a vehicle, such as shown in FIG. 3, or any other surface across which air may flow.

The terminals 40, 41 of the thermoelectric generator 60 are connected to a controller switch 65, the switch being connected to direct current from the thermoelectric generator either to a motor 66 (e.g. the motor of the vehicle of FIG. 3) or to a battery 67 (e.g. the battery of the vehicle of FIG. 3). The battery 67 is connected to supply operating current to a computer 68. A moisture sensor 69 is connected to the computer 68 and is mounted in a position to detect the moisture content of the layer 61, preferably at the downstream end thereof.

The system of FIG. 4 further includes a source of water or other volatile liquid, such as a tank 70. An outlet of the tank is directed via a valve 71 to a nozzle 72 positioned to direct liquid from the tank onto the upstream end of the absorbent layer 61. The valve is controlled by the computer 68.

In the arrangement of FIG. 4, the tank is advantageously sealed, with the air above the liquid being pressured. The air pressure in the tank thus can force the liquid from the tank to the nozzle, when the valve 71 is open, without the necessity of providing a pump. Alternatively, of course, a pump may be provided for the purpose, for example controlled by the computer, of the flow from the tank may be a gravity flow.

When the system of FIG. 4 is employed on a vehicle, movement of the vehicle causes air to flow in the direction of the arrow 75, to effect evaporation of liquid from the absorbent layer 61. At this time (i.e. when the vehicle is moving), the computer 68 controls the controller switch 65 to direct current to the motor of the vehicle, for example to constitute or supplement motive forces applied to the vehicle. The computer can detect movement of the vehicle by any conventional means, such as with a motion or speed detector 76.

When the sensor 76 detects that the vehicle is not moving, the computer 68 controls the controller switch 65 to direct current to recharge the batter 67, rather than to energize the motor 66.

It is of course apparent that the computer may be programmed to control the controller switch 65 in any other sequence, as desired.

The moisture sensor 69 signals the computer of the moisture content of the absorbent layer 61. When this layer has a moisture content below a predetermined level, the computer controls the opening of the valve 75 to direct more liquid to the layer 61, so that the moisture content of the layer is maintained above the predetermined level. It is of course apparent that the invention is not limited to this technique for moistening the absorbent layer 61.

Figure 5:
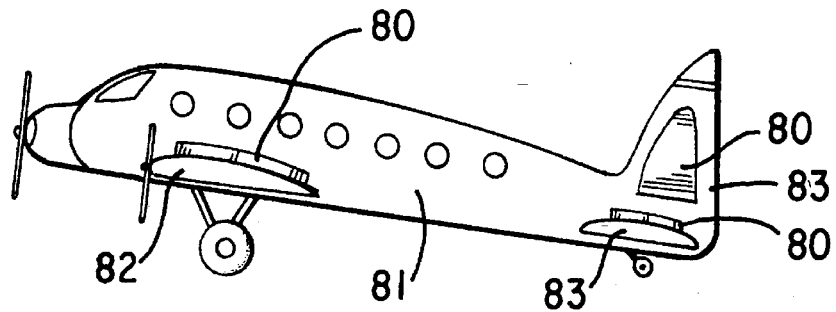
FIG. 5 is an illustration of an airplane provided with thermoelectric generators in accordance with the invention.

The thermoelectric generator of the invention may also be advantageously employed in other applications. For example, as illustrated in FIG. 5, thermoelectric generators 80 may be provided on, or built into, exposed surfaces of an airplane 81, such as on the wings 82 and tail surfaces 83. The current generated by these thermoelectric generators may be used for appliances in the airplane, if desired, although the invention is not limited to such use.

Figure 6:
FIG. 6 is an illustration of a building provided with thermoelectric generators in accordance with the invention.

The thermoelectric generator of the invention may also be employed for stationary applications, such as in dwellings or commercial buildings. For example, as illustrated in FIG. 6, thermoelectric generators 85 of the type illustrated in FIG. 1 may be mounted on the roof 86 of a building 87, for generating power for use in the building.

Figure 7:
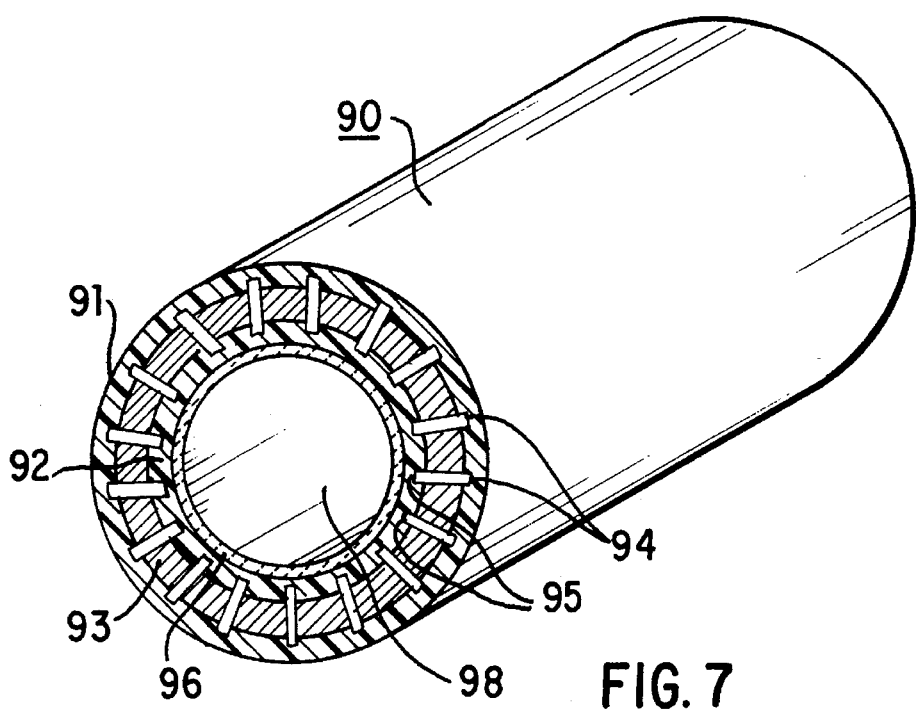
FIG. 7 is a cross sectional perspective view of a thermoelectric generator in accordance with a further embodiment of the invention.

As discussed above, the thermoelectric generator of the invention need not be comprised of a flat panel. For example, as illustrated in FIG. 7, the thermoelectric generator 90 may be cylindrical, having a thermally conductive electrically non-conductive annular outer layer 91 radially outwardly spaced from a similar layer 92 by an annular thermally and electrically non-conductive layer 93. As in the case of the embodiment of FIG. 1, thermocouples 94 are embedded in the layers 91 and 92, and interconnected to form a thermopile. An annular absorbent layer 96 is provided on the inner surface of the layer 91. The center of the structure of FIG. 7 is open, to form a duct 98 for the passage of air.

The thermoelectric generator of FIG. 7 is advantageously employed in locations where it is not generally expected that the generator will be exposed to sunlight, for example, under a moving vehicle.

While a few examples of use of the thermoelectric generator of the invention have been discussed, it is apparent that it may also be advantageously employ for may other purposes.

While the invention has been disclosed and described with reference to a limited number of embodiments, it will be apparent that variations and modification may be made therein, and it is therefore intended in the following claims to cover each such variation and modification as falls within the true spirit and scope of the invention.

What is claimed is:

1. A thermoelectric generator system comprising a thermoelectric generator having a plurality of thermocouples thermally coupled to separate spaced apart first and second members, said first and second members contacting said thermocouples with electrically non-conductive portions abutting said thermocouples, said thermocouples being interconnected to form a thermopile, said first member being exposed to radiation from the sun, and an absorbent layer affixed to said second member, said absorbent layer being exposed to environment external of said system, said system further comprising means for applying water to said absorbent layer, to effect cooling of said second member by evaporation of water from said absorbent layer to an environment external of said system, said system further comprising means spaced from said absorbent layer to form a channel therebetween, and means for directing air through said channel.

2. The thermoelectric generator system of claim 1 wherein said first and second members are thermally conductive and separated by a thermally non-conductive electrically non-conductive layer.

3. The thermoelectric generator system of claim 1 wherein said first and second layers comprise panels.

4. The thermoelectric generator system of claim 1 wherein said first and second layers are annular.

5. The thermoelectric generator system of claims 1 further comprising means for sensing the moisture content of said absorbent layer, and said means for applying water comprises means coupled to said sensing means for controlling the flow of water to said absorbent layer.

6. The thermoelectric generator system of claim 1 wherein said means for applying water comprises a sealed pressurized tank containing water, and means for directing water from said tank to said absorbent layer.

7. A thermoelectric generator comprising first and second spaced apart members having thermally conductive electrically non-conductive layers, said first member being exposed to be heated by radiation from the sun, a thermally and electrically non-conductive layer between said first and second layers, first and second groups of thermocouples thermally coupled to said first and second layers, respectively, with the thermocouples of said first and second groups being serially connected via conductors extending through said thermally non-conductive layer to form a thermopile, and a layer of a liquid absorbent material affixed to said second layer said layer of absorbent material being exposed to permit evaporation of liquid therefrom to the atmosphere.

8. The thermoelectric generator of claim 7 wherein said thermocouples are embedded in the respective first and second layers.

\* \* \* \* \*